(12) United States Patent
Haridass et al.

(10) Patent No.: US 9,021,411 B2
(45) Date of Patent: Apr. 28, 2015

(54) CHARACTERIZING TSV STRUCTURES IN A SEMICONDUCTOR CHIP STACK

(71) Applicant: International Business Machines Corporation, Armonk, NY (US)

(72) Inventors: Anand Haridass, Karnataka (IN); Subramanian S. Iyer, Mount Kisco, NY (US); Saravanan Sethuraman, Bangalore (IN); Ming Yin, Nanuet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/901,332

(22) Filed: May 23, 2013

(65) Prior Publication Data

US 2014/0351783 A1    Nov. 27, 2014

(51) Int. Cl.
*G06F 17/50* (2006.01)

(52) U.S. Cl.
CPC ........ *G06F 17/5059* (2013.01); *G06F 17/5031* (2013.01); *G06F 17/5081* (2013.01)

(58) Field of Classification Search
None
See application file for complete search history.

(56) References Cited

U.S. PATENT DOCUMENTS

| | | | |
|---|---|---|---|
| 6,223,328 B1 * | 4/2001 | Ito et al. | 716/113 |
| 6,448,168 B1 * | 9/2002 | Rao et al. | 438/598 |
| 6,557,152 B1 * | 4/2003 | Nakajima | 716/114 |
| 6,944,840 B2 * | 9/2005 | Sasaki et al. | 716/113 |
| 7,120,891 B2 * | 10/2006 | Yamamoto | 716/126 |
| 7,969,193 B1 | 6/2011 | Wu et al. | |
| 7,977,962 B2 | 7/2011 | Hargan et al. | |
| 8,063,654 B2 | 11/2011 | Rahman et al. | |
| 8,171,358 B2 | 5/2012 | Shin et al. | |
| 8,179,181 B2 * | 5/2012 | Lung et al. | 327/276 |
| 8,242,589 B2 | 8/2012 | Saen et al. | |
| 8,261,222 B2 * | 9/2012 | Nakamura | 716/114 |
| 8,294,149 B2 | 10/2012 | Bernstein et al. | |
| 2010/0295600 A1 | 11/2010 | Kim et al. | |
| 2011/0102011 A1 | 5/2011 | Van der Plas et al. | |
| 2012/0007624 A1 | 1/2012 | Byeon et al. | |

(Continued)

OTHER PUBLICATIONS

Loi, et al. "Characterization and Implementation of Fault-Tolerant Vertical Links for 3-D Networks-on-Chip". IEEE Transactions on Computer-Aided Design of Integrated Circuits and Systems, vol. 30, No. 1. Jan. 2011. pp. 12-134. Copyright IEEE 2010.

(Continued)

*Primary Examiner* — Leigh Garbowski
(74) *Attorney, Agent, or Firm* — Jinesh Patel; Michael J. Lestrange

(57) ABSTRACT

A first signal is transmitted through a first path. A computing device determines a signal propagation time of the first signal. The computing device transmits a second signal through a second path, wherein the second path includes the second signal traversing across at least one interconnecting structure. The computing device determines a signal propagation time of the second signal. The computing device determines a propagation time difference between the signal propagation time of the first signal and the signal propagation time of the second signal. The computing device adjusts a clock based on the determined propagation time difference.

19 Claims, 6 Drawing Sheets

(56) References Cited

U.S. PATENT DOCUMENTS

| | | | |
|---|---|---|---|
| 2012/0110402 A1 | 5/2012 | Wang et al. | |
| 2012/0124408 A1 | 5/2012 | Byeon et al. | |
| 2012/0248438 A1* | 10/2012 | Lung et al. | 257/48 |
| 2012/0249178 A1 | 10/2012 | Su et al. | |
| 2012/0262197 A1 | 10/2012 | Bernstein et al. | |
| 2012/0264241 A1 | 10/2012 | Bernstein et al. | |

OTHER PUBLICATIONS

"Method and System for Testing and Diagnosing Through-Silicon Via (TSV) in Three-Dimensional (3D) Integrated Circuits (ICs)". IP.com PriorArtDatabase. Technical Disclosure. IP.com No. IPCOM000200333D. IP.com Electronic Publication: Oct. 6, 2010.

Cordero, et al., "U.S. Appl. No. 13/733,198", filed Jan. 3, 2013.

* cited by examiner

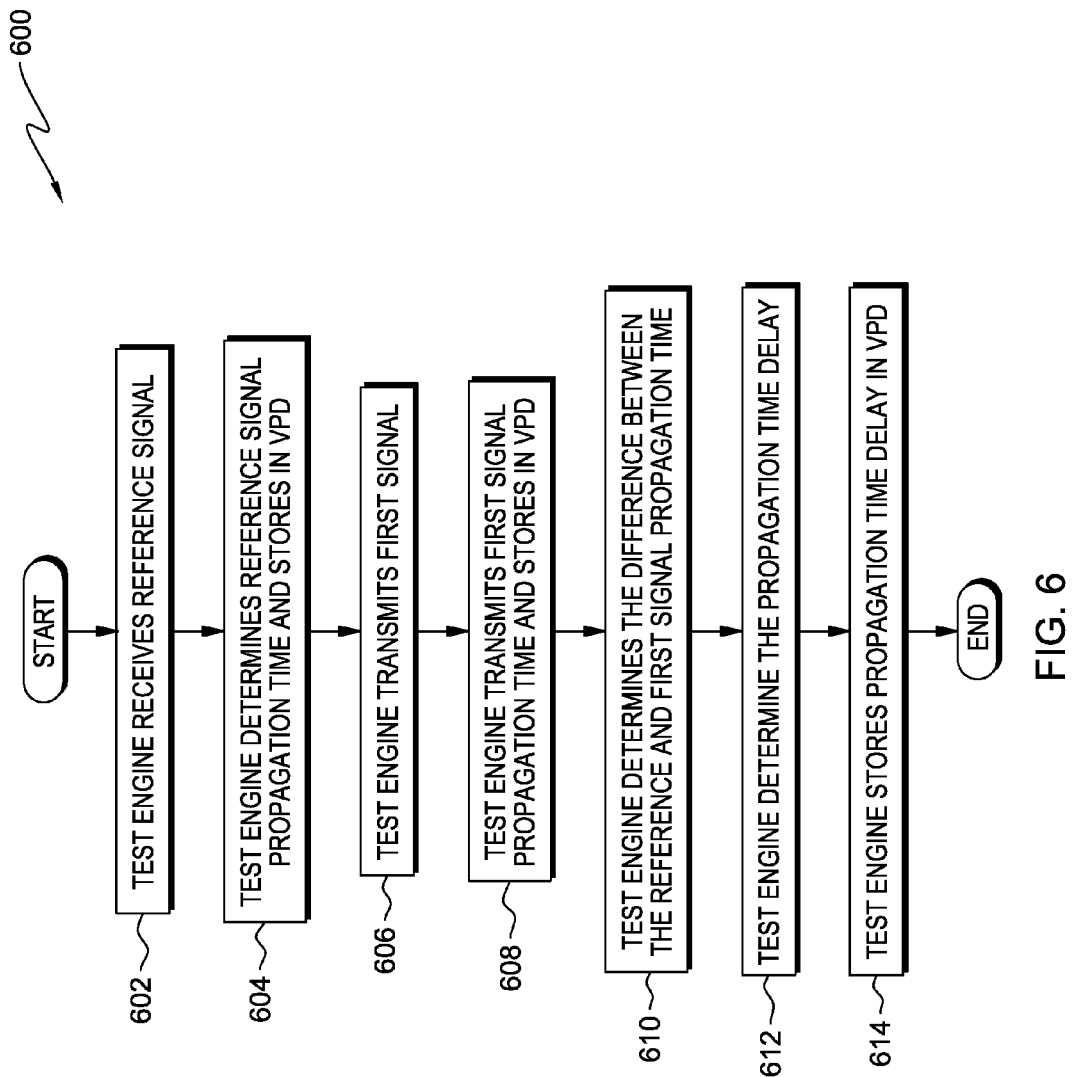

CHARACTERIZING TSV STRUCTURES IN A SEMICONDUCTOR CHIP STACK

FIELD OF THE INVENTION

The present invention relates generally to semiconductor fabrication, and more particularly to characterizing TSV structures and determining signal propagation time delays in a 3-D chip stack.

BACKGROUND

3-D semiconductor die stacking is an emerging and exciting technology which offers lower power consumption, reduced form factor and interface latency with improved bandwidth. A lot of research is underway to improvise the electrical performance of multi-stacked die chips including reliability at both the package and board-level. A majority of the benefit from multi-die stacking comes from the reduction in wire delays across chips, which in turn results in reducing the latency, power consumption and with an increase in the bandwidth.

The Through Silicon Vias (TSVs) in a 3-D stack are the channels for transferring signals between different tiers in a 3-D stack. The functionality of a 3-D integrated circuit strongly depends on the fidelity of signals through TSVs. Defects can be created in the TSV process while forming the TSVs before bonding (assuming a via-first process) or while bonding different dies together. Specifically, TSVs are susceptible to short defects. A short during TSV formation creates a resistive defect through the oxide. Since the substrate surrounding the TSVs is strongly connected to ground, this results in a low resistive path between the TSV and ground. Such shorts in the TSV will result in partial or complete degradation of signal quality. When the TSV is driven by a driver, the signal swing and/or slew at the receiver end can vary significantly resulting in either complete or partial signal degradation. Therefore, maintaining the signal fidelity through TSVs, especially on critical interfaces such as high speed serial links which establish communication in a system on a chip, is a primary challenge in 3-D system integration. TSV technology drives the integration of chips in 3-D packaging and overall integrated circuit reliability depends on TSVs and therefore it is important for TSVs to be free from defects.

Micro C4 (μC4) bumps are solder bumps used to form connections between two semiconductor dies. TSVs and μC4 bumps are often used together to form the interconnecting structure between two semiconductor dies. A signal traveling from a first semiconductor die to a second die travels through a TSV and a μC4 bump to reach the second die, which may result in signal propagation time delays.

SUMMARY

Embodiments of the present invention provide a system and method for determining signal propagation time delays for signals transmitted in a microelectronic device. A first signal is transmitted through a first path. A computing device determines a signal propagation time of the first signal. The computing device transmits a second signal through a second path, wherein the second path includes the second signal traversing across at least one interconnecting structure. The computing device determines a signal propagation time of the second signal. The computing device determines a propagation time difference between the signal propagation time of the first signal and the signal propagation time of the second signal. The computing device adjusts a clock based on the determined propagation time difference.

BRIEF DESCRIPTION OF THE SEVERAL VIEWS OF THE DRAWINGS

FIG. 6 is a flowchart that illustrates a process for determining signal propagation time delays in a semiconductor system containing a single test engine, in accordance with an embodiment of the invention.

DETAILED DESCRIPTION

Figure 1:
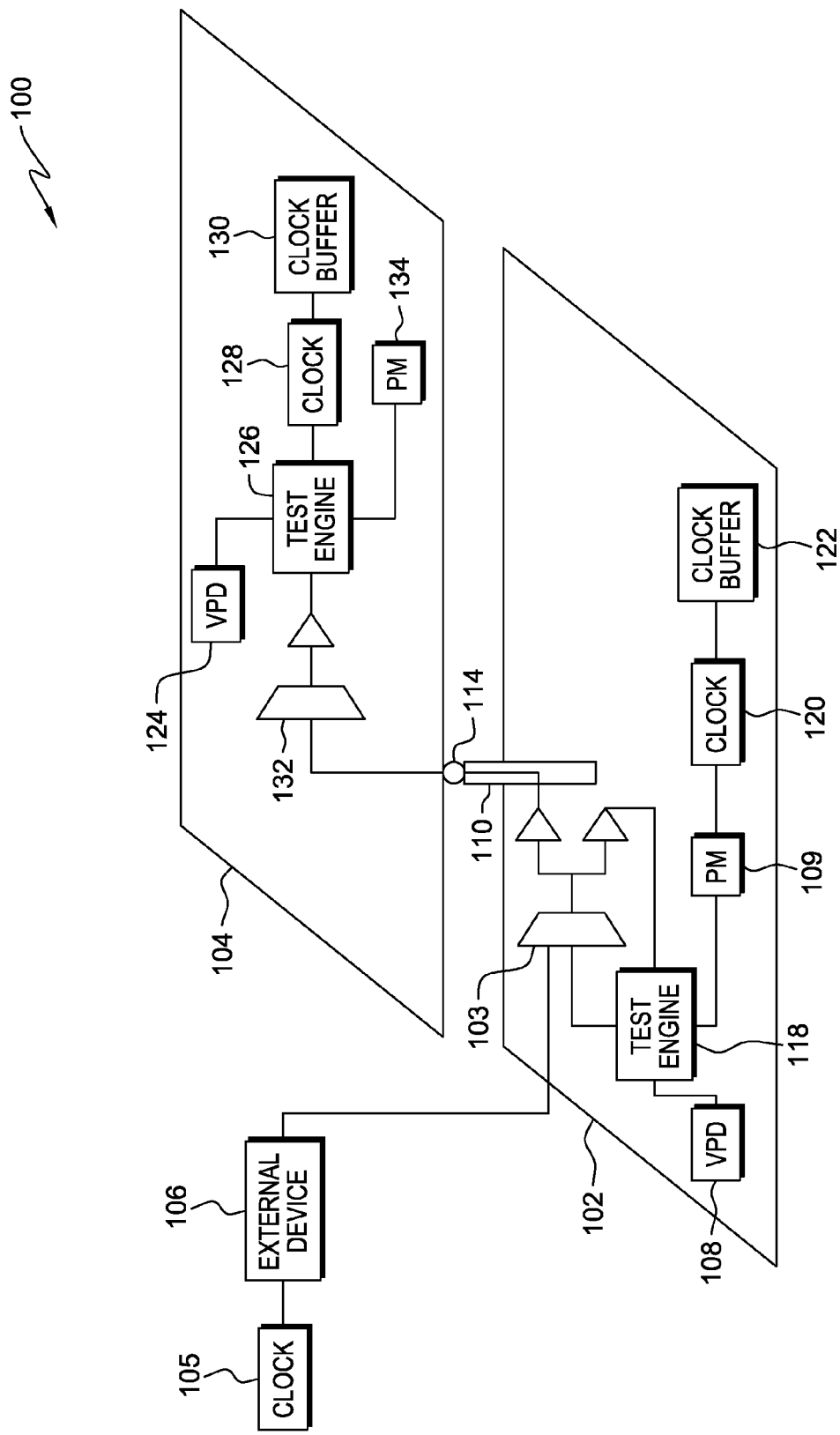
FIG. 1 depicts a semiconductor system containing multiple test engines and a connected external device, in accordance with an embodiment of the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code/instructions embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Embodiments of the present invention will now be described in detail with reference to the accompanying Figures.

FIG. 1 depicts semiconductor system 100, in accordance with an exemplary embodiment of the invention. In the exemplary embodiment, semiconductor system 100 contains a first semiconductor die, die 102, and a second semiconductor die, die 104, that are connected via TSV 110 and µC4 bump 114, as well as external device 106 and clock 105 that connect directly to die 102.

Die 102 contains test engine 118, clock 120, VPD 108, clock buffer 122, power management device 109 and multiplexer 103. Multiplexer 103 is a hardware device that receives a signal from test engine 118 and transmits the signal to the appropriate transmit TSV. In the exemplary embodiment, multiplexer 103 is a 1-to-1 hardware device, meaning that multiplexer 132 is capable of transmitting a received signal to one transmit TSV, i.e., TSV 110. However, in other embodiments, multiplexer 103 can be a 2-to-1 hardware device or a 3-to-1 hardware device, meaning multiplexer 103 would represent a plurality of multiplexers located on die 102.

Clock 120 is a hardware device that measures the signal propagation time of a signal travelling through semiconductor system 100. In the exemplary embodiment, clock 120 is interconnected to other clock devices in semiconductor system 100, with all clocks in semiconductor system 100 functioning together as a single clock. In the exemplary embodiment, test engine 118 starts clock 120 when a signal is transmitted from test engine 118 to multiplexer 103. Clock 120 stops when the signal is received by test engine 118 or by a test engine located on die 104, which in turn stops all clocks in semiconductor system 100.

Clock buffer 122 is a hardware device that is capable of delaying clock 120 so that a signal transmitted to die 102 and received by test engine 118, arrives at a time expected by test engine 118. For example, for a signal transmitted from die 104 to test engine 118, the signal may be delayed due to having to traverse across TSV 110 and µC4 bump 114. In this example, clock buffer 122 may delay clock 120 to account for the signal propagation time delay caused by the TSV/µC4 bump so that the signal arrives at test engine 118 at the expected time.

Power management device 109 is a hardware device capable of controlling and regulating power supply voltage on die 102.

VPD 108 (vital product data) is a memory device that, in the exemplary embodiment, stores characterization information, such as signal propagation time delays for each signal propagation path. For example, referring to the example above, test engine 118 may store the signal propagation time delay caused by a signal traversing across TSV 110 and µC4 bump 114 in VPD 108. In the exemplary embodiment, the signal propagation time delay is stored in association with the origin of the signal. For example, test engine 118 may store the signal propagation time delay experienced by a signal traversing across TSV 110 and µC4 bump 114 in association with die 104. In other embodiments, test engine 118 may store the signal propagation time delay in association with the path the signal traveled. In addition, VPD 108 may also store other information such as defective test paths identified by test engine 118.

Test engine 118 is a hardware device capable of coordinating all operations of clock 120, clock buffer 122, VPD 108, power management device 109 and multiplexer 103. In the exemplary embodiment, test engine 118 calculates signal propagation time differences between signals traveling through two or more test paths in order to determine signal propagation time delays experienced by signals due to traversal across one or more TSVs and µC4 bumps.

External device 106 is a hardware device capable of transmitting a signal, which serves as a reference signal used to calculate signal propagation time delay, directly to die 102 via multiplexer 103. In the exemplary embodiment, external device 106 is coupled with clock 105. Clock 105 is a hardware device capable of measuring signal propagation time. As stated above, in the exemplary embodiment, clock 105 is interconnected to other clock devices, such as clock 105 and clock 120, in semiconductor system 100, with all clocks functioning as a single clock.

Die 104 contains test engine 126, VPD 124, clock 128, clock buffer 130, power management device 134 and multiplexer 132. In the exemplary embodiment, multiplexer 132 is a hardware device that receives a signal from die 102 via a transmit TSV and μC4 bump, such as TSV 110 and μC4 bump 114. Multiplexer 132 then transmits the signal to test engine 126. In the exemplary embodiment, multiplexer 132 is a 1-to-1 hardware device, however, in other embodiments, multiplexer 132 can be a 3-to-1 hardware device or a 2-to-1 hardware device.

Clock 128 is a hardware device that measures the signal propagation time of a signal travelling through semiconductor system 100. In the exemplary embodiment, clock 128 is interconnected to clock 120 and clock 105, with all clocks functioning together as a single clock. In the exemplary embodiment, for a signal travelling from die 102 to die 104, test engine 118 starts clock 120, when a signal is transmitted from test engine 118 to multiplexer 103, which in turn starts clock 128 as well. When test engine 126 receives the signal, test engine 126 stops clock 128, which in turn stops clock 120 as well.

Clock buffer 130 is a hardware device that is capable of delaying clock 128 so that a signal transmitted to die 104 and received by test engine 126, arrives at a time expected by test engine 126. For example, for a signal transmitted from die 102 to test engine 126, the signal may be delayed due to having to traverse across TSV 110 and μC4 bump 114. In this example, clock buffer 130 may delay clock 128 to account for the signal propagation time delay caused by the TSV/μC4 bump so that the signal arrives at test engine 126 at the expected time.

VPD 124 is a memory device that, in the exemplary embodiment, stores characterization information, such as signal propagation time delays for each signal propagation path. For example, referring to the example above, test engine 126 may store the signal propagation time delay caused by a signal traversing across TSV 110 and μC4 bump 114 in VPD. In the exemplary embodiment, the signal propagation time delay is stored in association with the origin of the signal. For example, test engine 126 may store the signal propagation time delay experienced by a signal traversing across TSV 110 and μC4 bump 114 in association with die 102. In other embodiments, test engine 126 may store the signal propagation time delay in association with the path the signal traveled. In addition, VPD 124 may also store other information such as defective test paths identified by test engine 126.

Test engine 126 is a hardware device capable of coordinating all operations of clock 128, clock buffer 130, VPD 124, power management device 134 and multiplexer 132. In the exemplary embodiment, test engine 126 calculates signal propagation time differences between signals traveling through two or more test paths in order to determine signal propagation time delays experienced by signals due to traversal across one or more TSVs and μC4 bumps.

Power management device 134 is a hardware device capable of controlling and regulating power supply voltage for semiconductor die 104.

Figure 2:
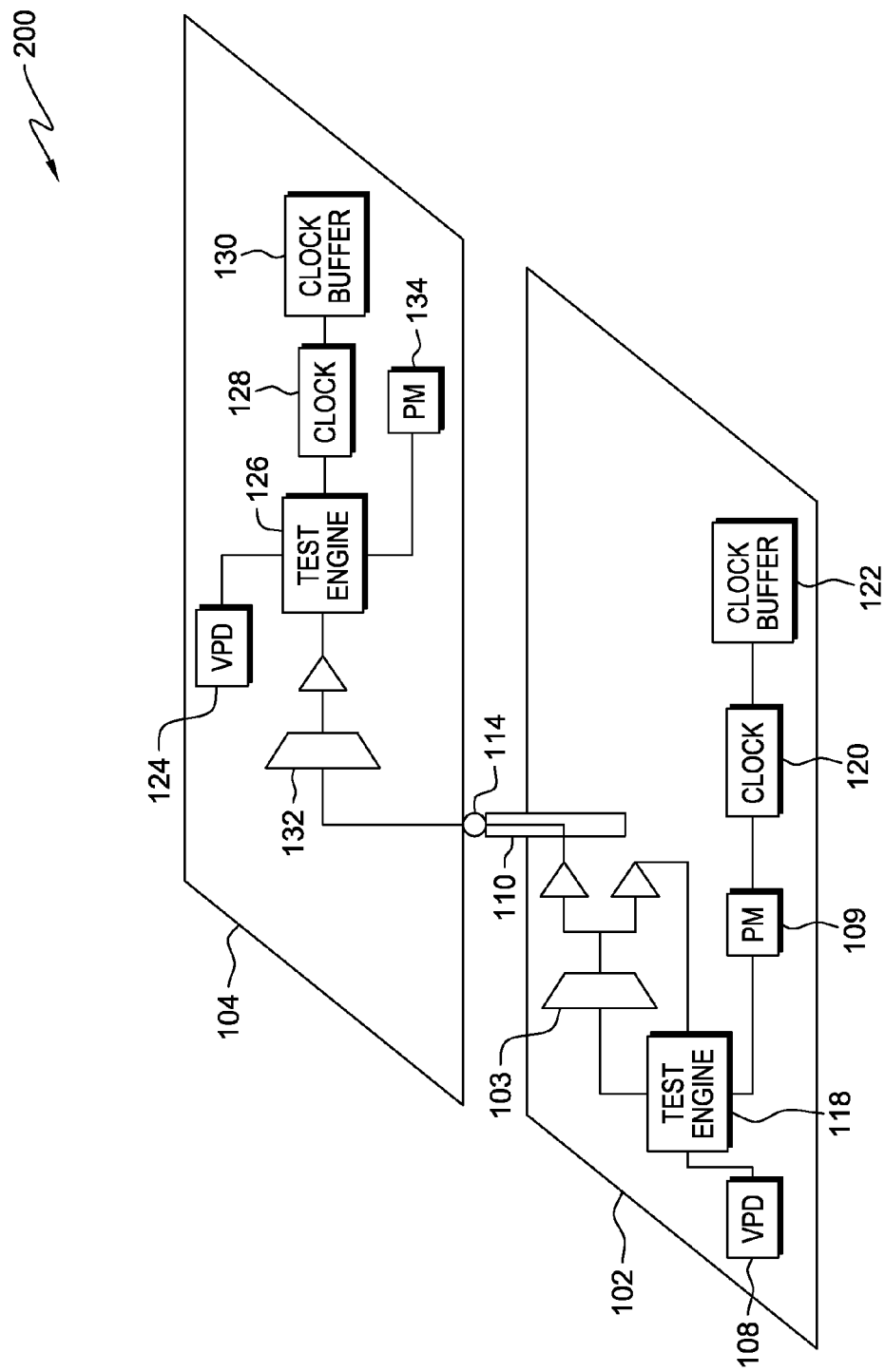
FIG. 2 depicts a semiconductor system containing multiple test engines and no connected external device, in accordance with an embodiment of the invention.

FIG. 2 depicts semiconductor system 200, in accordance with an exemplary embodiment of the invention. In the exemplary embodiment, semiconductor system 100 contains a first semiconductor die, die 102, and a second semiconductor die, die 104, that are connected via TSV 110 and μC4 bump 114.

In the exemplary embodiment, semiconductor system 200 does not contain an external device or an external clock. Instead, all signal originate and are transmitted by either test engine 118 or test engine 126.

Figure 3:
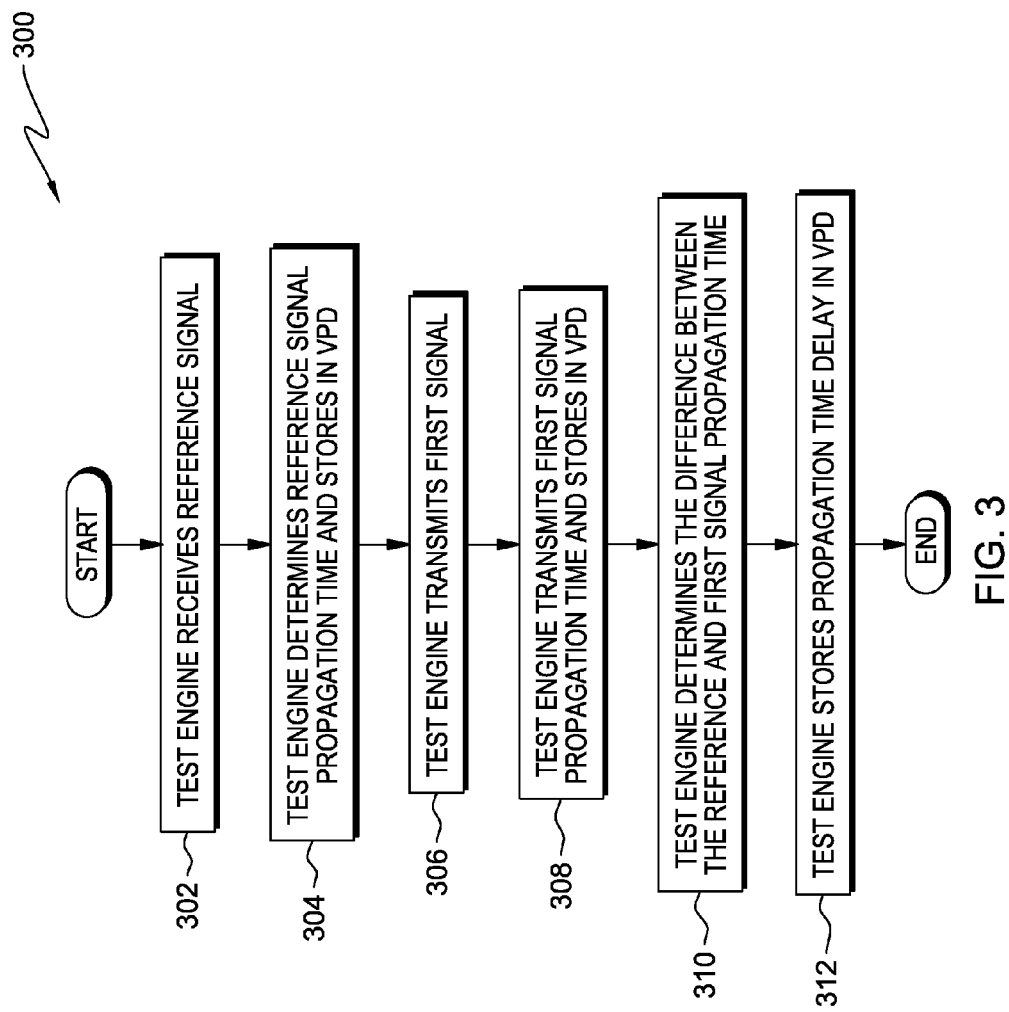
FIG. 3 is a flowchart that illustrates a process for determining signal propagation time delays in a semiconductor system containing multiple test engines, in accordance with an embodiment of the invention.

FIG. 3 is a flowchart that illustrates a process for determining the signal propagation time delay experienced by a signal due to traversal across a TSV and μC4 bump for a multiple test engine system, in accordance with an embodiment of the invention. In the exemplary embodiment, test engine 118 receives a reference signal from external device 106 via multiplexer 103 (step 302). As stated above, in the exemplary embodiment, external device 106 transmits a signal that serves as a reference signal which is compared to a signal transmitted by test engine 118 in order to determine a signal propagation time delay. In addition, as stated above, all clocks in semiconductor system 100 and 200 are directly connected and function as a single clock. Therefore, when external device 106 transmits the reference signal to test engine 118, external device 106 starts clock 105, which in turn starts clock 120 and clock 128 as well. When test engine 118 receives the reference signal from external device 106, test engine 118 stops clock 120, which in turn stops all clocks in semiconductor system 100. In other embodiments, where there is no external device, as depicted by semiconductor system 200, test engine 118 transmits a reference signal through a loop as depicted in FIG. 2. Test engine 118 transmits the reference signal to multiplexer 103 which loops the reference signal back to test engine 118. In addition, in this embodiment, test engine 118 starts clock 120 when test engine 118 transmits the reference signal and stops clock 120 when test engine 118 receives the reference signal from multiplexer 103.

Test engine 118 then determines the reference signal propagation time (step 304). In the exemplary embodiment, test engine 118 determines the reference signal propagation time by calculating the difference between the start and stop time of clock 120. Test engine 118 then stores the determined reference signal propagation time in a memory device, such as VPD 108, in association with an identifier such as the origin of the signal or the path taken by the signal. In other embodiments, test engine 126 may also calculate and store the reference signal propagation time in VPD 124.

Test engine 118 then transmits a first signal to test engine 126 (step 306). In the exemplary embodiment, test engine 118 transmits the first signal to test engine 126 via multiplexer 103, the combination of TSV 110 and μC4 bump 114, and via multiplexer 132. In addition, test engine 118 starts clock 120 (and in turn clock 128 as well) when test engine 118 transmits the first signal and test engine 126 stops clock 128 (and in turn clock 120 as well) when test engine 126 receives the first signal.

Test engine 118 then determines the first signal propagation time (step 308). In the exemplary embodiment, test engine 118 determines the first signal propagation time by calculating the difference between the start and stop time of clock 120. Test engine 118 then stores the determined first signal propagation time in a memory device, such as VPD 108, in association with an identifier such as the origin of the signal or the path taken by the signal. In other embodiments, test engine 126 determines the first signal propagation time in the same manner and stores the determined first signal propagation time in VPD 124.

Test engine 118 then determines the difference in time between the reference and first signal propagation time (step 310). In the exemplary embodiment, the difference in time between the reference signal propagation time and the first signal propagation time represents the approximate time delay incurred by the first signal traversing across TSV 110 and μC4 bump 114.

Test engine 118 then stores the determined approximate signal propagation time delay in VPD 108 (step 312). In the exemplary embodiment, the signal propagation time delay is stored in association with an identifier such as the path or destination of the non-reference signal (first signal), i.e., die 104 or test engine 126. Therefore, when a subsequent signal is transmitted by, for example, test engine 126 to test engine 118, using the same signal path, such as the same TSV/μC4 bump combination, test engine 118 will be able to determine the appropriate time delay that clock buffer 122 should apply to clock 120 so that the signal is received at the expected time. In other embodiments, test engine 118 may assume that all TSV/μC4 bump combinations connecting die 102 and die 104 create approximately equal signal propagation time delays and therefore, even if the subsequent signal transmitted by test engine 126 to test engine 118 takes a different signal path, test engine 118 can coordinate clock buffer 122 to apply the same time delay to clock 120. In addition, in other embodiments, test engine 126 may also store the determined signal propagation time difference in VPD 124 as well. Therefore, if a signal is transmitted by test engine 118 to test engine 126 using the same signal path, test engine 126 can coordinate the time delay clock buffer 130 applies to clock 128 accordingly.

In addition, in further embodiments, rather than coordinating clock buffer 122 to apply a time delay to clock 120, test engine 118 may instead coordinate with power management device 109 to reduce the voltage applied to die 102 which can also create a time delay for clock 120. Since the time delay applied to clock 120 is reversely proportional to the voltage value applied to die 102, if power management 109 reduces the voltage applied, the time delay applied to clock 120 increases. Therefore, in this embodiment, test engine 118 may coordinate with power management 109 to reduce the voltage to an appropriate level so that the desired time delay is applied to clock 120. In addition, test engine 126 can apply the same methodology to create an appropriate time delay for clock 128.

Furthermore, if a semiconductor device has three dies instead of two, the same methodology can be applied to the third die. Each test engine (test engine 118 and test engine 126) transmits a signal to the test engine on the third die and compares the signal propagation time to the reference signal propagation time to determine the signal propagation time difference/time delay for a signal traversing across one TSV/μC4 bump combination (signal originating in die 104) and for a signal traversing across two TSV/μC4 bump combinations (signal originating in die 102). In other embodiments, the signal propagation time delay traversing across the second TSV/μC4 bump combination may be assumed to be the same as the signal propagation time delay incurred by a signal traversing across the first TSV/μC4 bump combination. Therefore, the test engine on the third die multiplies the signal propagation time delay of a signal traversing.

Figure 4:
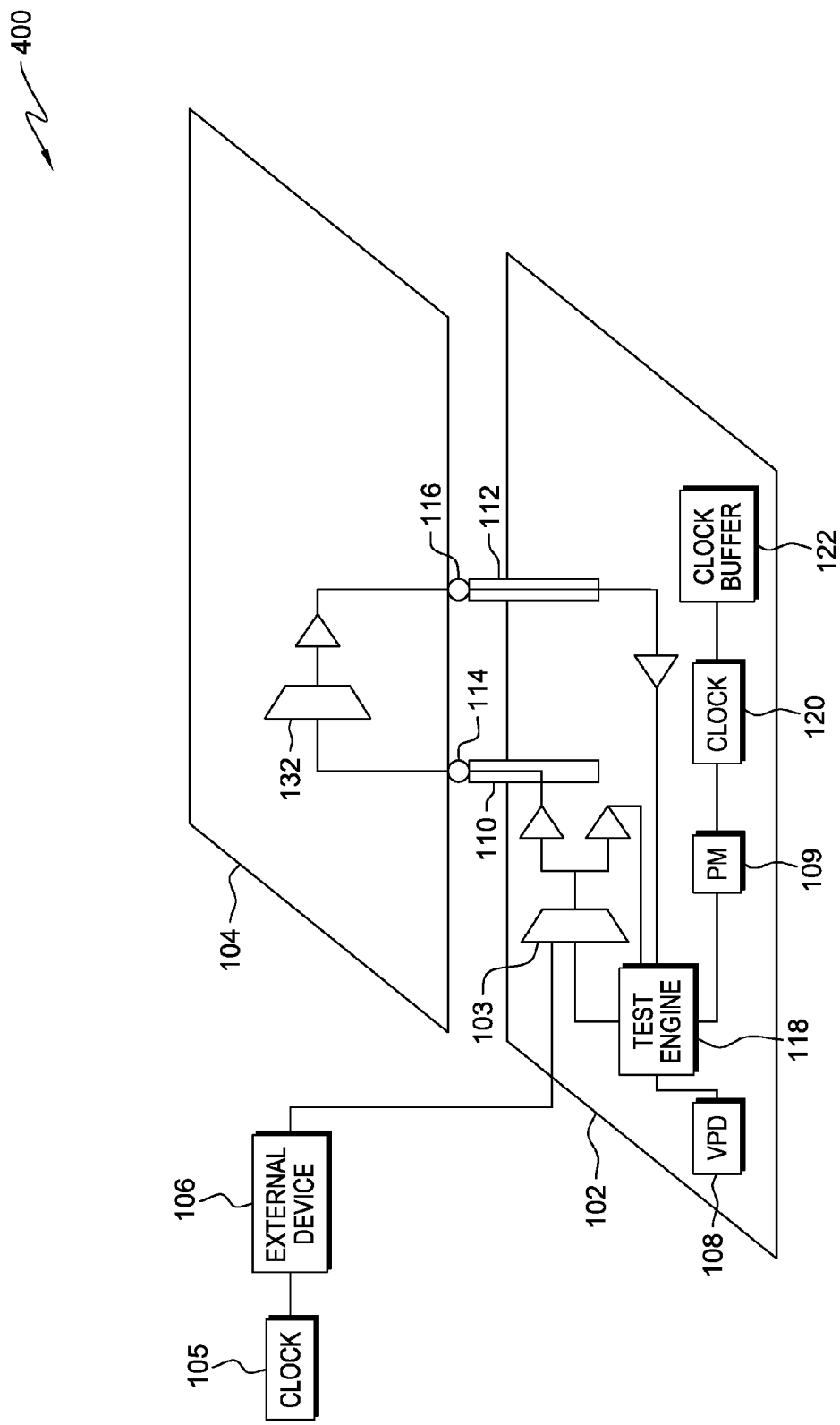
FIG. 4 depicts a semiconductor system containing a single test engine and a connected external device, in accordance with an embodiment of the invention.

FIG. 4 depicts semiconductor system 400, in accordance with an exemplary embodiment of the invention. In the exemplary embodiment, semiconductor system 400 contains a first semiconductor die, die 102, and a second semiconductor die, die 104, that are connected via TSV 110, μC4 bump 114, TSV 112, and μC4 bump 116. In addition, semiconductor system 400 contains clock 105 and external device 106 which are directly connected to die 102. Die 102 contains test engine 118, multiplexer 103, clock 120, clock buffer 122, power management device 109, and VPD 108. However, unlike semiconductor system 100 and 200 discussed above, semiconductor system 400 has only one test engine, test engine 118, which coordinates and controls all signals traversing through both die 102 and die 104. In addition, in this system, power management device 109 is capable of controlling and regulating power supply voltage for die 102 and die 104 of semiconductor system 400.

Figure 5:
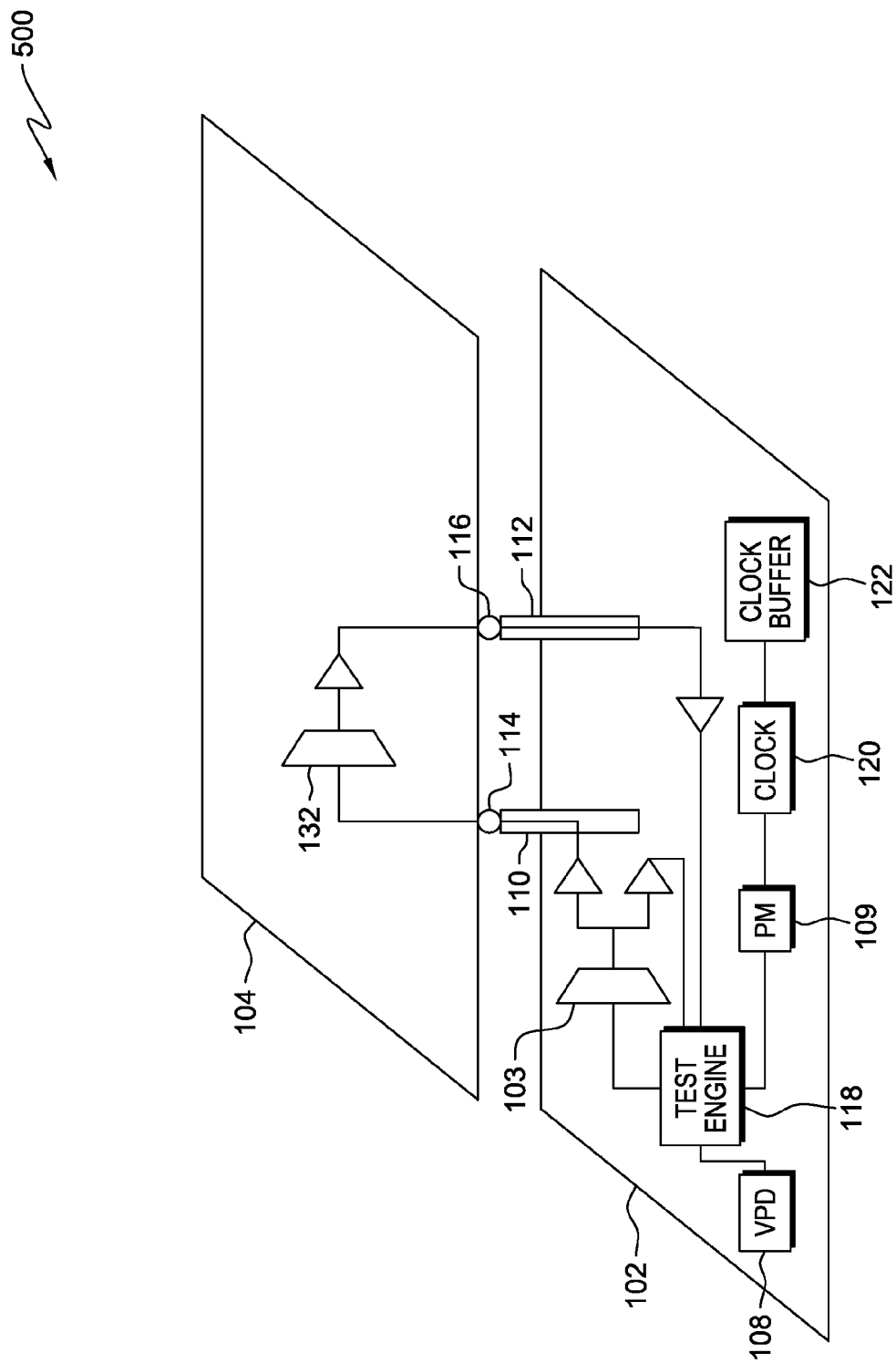
FIG. 5 depicts a semiconductor system containing a single test engine and no connected external device, in accordance with an embodiment of the invention.

FIG. 5 depicts semiconductor system 500, in accordance with an exemplary embodiment of the invention. In the exemplary embodiment, semiconductor system 500 contains a first semiconductor die, die 102, and a second semiconductor die, die 104, that are connected via TSV 110, μC4 bump 114, TSV 112, and μC4 bump 116. In addition, similar to semiconductor system 400, semiconductor system 500 contains only one test engine, test engine 118, which coordinates and controls all signal traversing through both die 102 and die 104. In the exemplary embodiment, semiconductor system 500 also does not contain an external device or an external clock. Instead, all signals originate and are transmitted by test engine 118. In addition, in this system, power management device 109 is capable of controlling and regulating power supply voltage for die 102 and die 104 of semiconductor system 500.

FIG. 6 is a flowchart that illustrates a process for determining the signal propagation time delay experienced by a signal due to traversal across a TSV and μC4 bump for a single test engine semiconductor system, in accordance with an embodiment of the invention. In the exemplary embodiment, test engine 118 receives a reference signal from external device 106 via multiplexer 103 (step 602). As stated above, in the exemplary embodiment, external device 106 transmits a signal that serves as a reference signal which is compared to a signal transmitted by test engine 118 in order to determine a signal propagation time delay. In addition, as stated above, all clocks in semiconductor system 400 and 500 are directly connected and function as a single clock. Therefore, when external device 106 transmits the reference signal to test engine 118, external device 106 starts clock 105, which in turn starts clock 120 and clock 128 as well. When test engine 118 receives the reference signal from external device 106, test engine 118 stops clock 120, which in turn stops all clocks in semiconductor system 400. In other embodiments, where there is no external device, as depicted by semiconductor system 500, test engine 118 transmits a reference signal through a loop as depicted in FIG. 5. Test engine 118 transmits the reference signal to multiplexer 103 which loops the reference signal back to test engine 118. In addition, in this embodiment, test engine 118 starts clock 120 when test engine 118 transmits the reference signal and stops clock 120 when test engine 118 receives the reference signal from multiplexer 103.

Test engine 118 then determines the reference signal propagation time (step 604). In the exemplary embodiment, test engine 118 determines the reference signal propagation time by calculating the difference between the start and stop time of clock 120. Test engine 118 then stores the determined reference signal propagation time in a memory device, such as VPD 108, in association with an identifier such as the origin of the signal or the path taken by the signal.

Test engine 118 then transmits a first signal through a loop that includes the first signal traveling to die 104 via multiplexer 103, TSV 110 and μC4 bump 114 and back to test engine 118 via multiplexer 132, μC4 bump 116, and TSV 112 (step 606). In addition, test engine 118 starts clock 120 when test engine 118 transmits the first signal and stops clock 120 when test engine 118 receives the first signal.

Test engine 118 then determines the first signal propagation time (step 608). In the exemplary embodiment, test engine 118 determines the first signal propagation time by calculating the difference between the start and stop time of clock 120. Test engine 118 then stores the determined first signal propagation time in a memory device, such as VPD 108, in association with an identifier such as the origin of the signal or the path taken by the signal.

Test engine 118 then determines the difference in time between the reference and first signal propagation time (step 610). In the exemplary embodiment, the difference in time between the reference signal propagation time and the first signal propagation time represents the approximate time delay incurred by the first signal traversing across TSV 110, μC4 bump 114, TSV 112, and μC4 bump 116.

Test engine 118 then determines the propagation time delay associated with a signal traversing across a TSV/μC4 bump combination (step 612). As stated above, the difference in time between the reference signal propagation time and the first signal propagation time represents the approximate time delay for a signal traversing across two sets of TSV/μC4 bump combinations. Therefore, in the exemplary embodiment, since the delay in time caused by a signal traversing across the combination of TSV 110 and μC4 bump is assumed to be approximately equal to the delay in time caused by a signal traversing across the combination of TSV 112 and μC4 bump 116, test engine 118 divides the determined difference in time between the reference and first signal propagation time by two in order to determine the propagation time delay associated with a signal traversing across a TSV/μC4 bump combination.

Test engine 118 then stores the determined propagation time delay for the first signal propagation time in VPD 108 (step 614). In the exemplary embodiment, the propagation time delay is stored in association with an identifier such as the path or destination of the signal (the destination before the signal is looped back to test engine 118). For example, if a destination identifier is used by test engine 118 for the first signal, the identifier may be die 104.

Therefore, as stated above, when a subsequent signal is transmitted by test engine 118, using the same signal path, such as the same TSV/μC4 bump combination, test engine 118 will be able to determine the appropriate time delay so that the signal is received at the expected time. In addition, test engine 118 may coordinate with power management device 109 to create the appropriate time delay in the same manner as discussed above.

Furthermore, if a semiconductor device has three dies instead of two, the same methodology can be applied to the third die. Test engine 118 transmits a signal on a loop to the third die and back. The signal propagation time is then determined and compared to the reference signal propagation time to determine the signal propagation time difference/time delay for a signal traversing across two TSV/μC4 bump combinations. In other embodiments, the signal propagation time delay traversing across the second TSV/μC4 bump combination may be assumed to be the same as the signal propagation time delay incurred by a signal traversing across the first TSV/μC4 bump combination. Therefore, test engine 118 multiplies the signal propagation time delay determined for the first signal by two to determine the signal propagation time delay for a signal transmitted from test engine 118 to the third die.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed, which are within the scope of the invention as outlined by the appended claims.

What is claimed is:

1. A method for determining signal propagation time delays for signals transmitted in a microelectronic device, wherein the microelectronic device comprises of a first layer and a second layer interconnected by at least one interconnecting structure, comprising the steps of:
   transmitting a first signal through a first path;
   a test engine determining a signal propagation time of the first signal;
   transmitting a second signal through a second path, wherein the second path includes the second signal traversing across at least one interconnecting structure, and wherein the at least one interconnecting structure comprises of one or more of a through silicon via and a micro C4 bump combination;
   the test engine determining a signal propagation time of the second signal;
   the test engine determining a propagation time difference between the signal propagation time of the first signal and the signal propagation time of the second signal;
   the test engine storing the determined propagation time difference in association with an identifier associated with the second path;
   the test engine determining that a third signal is to be transmitted through the second path; and
   responsive to determining that a third signal is to be transmitted through the second path, the test engine adjusting a clock based on the determined propagation time difference.

2. The method of claim 1, wherein the first path includes the first signal being transmitted by an external device to a computing device on the first layer.

3. The method of claim 1, wherein the first path includes the first signal being transmitted by a computing device located on the first layer through a loop and being received by the computing device on the first layer.

4. The method of claim 1, wherein the second path includes the second signal traversing across one interconnecting structure.

5. The method of claim 4, wherein the clock is adjusted an amount of time equal to the determined propagation time difference.

6. The method of claim 1, wherein the second path includes the second signal traversing across more than one interconnecting structures.

7. The method of claim 6, wherein the determined propagation time difference is divided by the number of interconnecting structures traversed by the second signal to determine a modified propagation time difference and the clock is adjusted by an amount of time equal to the modified propagation time difference.

8. A computer program product for determining signal propagation time delays for signals transmitted in a microelectronic device, wherein the microelectronic device comprises of a first layer and a second layer interconnected by at least one interconnecting structure, the computer program product comprising:
one or more computer-readable storage devices and program instructions stored on at least one of the one or more tangible storage devices, the program instructions comprising:
program instructions to transmit a first signal through a first path;
program instructions to determine a signal propagation time of the first signal;
program instructions to transmit a second signal through a second path, wherein the second path includes the second signal traversing across at least one interconnecting structure, and wherein the at least one interconnecting structure comprises of one or more of a through silicon via and a micro C4 bump combination;
program instructions to determine a signal propagation time of the second signal;
program instructions to determine a propagation time difference between the signal propagation time of the first signal and the signal propagation time of the second signal;
program instructions to store the determined propagation time difference in association with an identifier associated with the second path;
program instructions to determine that a third signal is to be transmitted through the second path; and
responsive to determining that a third signal is to be transmitted through the second path, program instructions to adjust a clock based on the determined propagation time difference.

9. The computer program product of claim 8, wherein the first path includes the first signal being transmitted by an external device to a computing device on the first layer.

10. The computer program product of claim 8, wherein the first path includes the first signal being transmitted by a computing device located on the first layer through a loop and being received by the computing device on the first layer.

11. The computer program product of claim 8, wherein the second path includes the second signal traversing across one interconnecting structure.

12. The computer program product of claim 11, wherein the clock is adjusted an amount of time equal to the determined propagation time difference.

13. The computer program product of claim 8, wherein the second path includes the second signal traversing across more than one interconnecting structures.

14. The computer program product of claim 13, wherein the determined propagation time difference is divided by the number of interconnecting structures traversed by the second signal to determine a modified propagation time difference and the clock is adjusted by an amount of time equal to the modified propagation time difference.

15. A system for determining signal propagation time delays for signals transmitted in a microelectronic device, wherein the system comprises of a first layer and a second layer interconnected by at least one interconnecting structure, the system comprising:
one or more processors, one or more computer-readable memories, one or more computer-readable tangible storage devices, and program instructions stored on at least one of the one or more storage devices for execution by at least one of the one or more processors via at least one of the one or more memories, the program instructions comprising:
program instructions to transmit a first signal through a first path;
program instructions to determine a signal propagation time of the first signal;
program instructions to transmit a second signal through a second path, wherein the second path includes the second signal traversing across at least one interconnecting structure, and wherein the at least one interconnecting structure comprises of one or more of a through silicon via and a micro C4 bump combination;
program instructions to determine a signal propagation time of the second signal;
program instructions to determine a propagation time difference between the signal propagation time of the first signal and the signal propagation time of the second signal;
program instructions to store the determined propagation time difference in association with an identifier associated with the second path;
program instructions to determine that a third signal is to be transmitted through the second path; and
responsive to determining that a third signal is to be transmitted through the second path, program instructions to adjust a clock based on the determined propagation time difference.

16. The system of claim 15, wherein the first path includes the first signal being transmitted by a computing device located on the first layer through a loop and being received by the computing device on the first layer.

17. The system of claim 15, wherein the clock is adjusted an amount of time equal to the determined propagation time difference.

18. The system of claim 15, wherein the second path includes the second signal traversing across more than one interconnecting structures.

19. The system of claim 18, wherein the determined propagation time difference is divided by the number of interconnecting structures traversed by the second signal to determine a modified propagation time difference and the clock is adjusted by an amount of time equal to the modified propagation time difference.

* * * * *